(12) United States Patent  
Chen et al.

(10) Patent No.: US 12,423,773 B2
(45) Date of Patent: Sep. 23, 2025

(54) IMAGE DATA PROCESSING METHOD FOR LASER IMAGING, COMPUTER DEVICE, AND COMPUTER-READABLE STORAGE MEDIUM

(71) Applicant: SHENZHEN ANTELAND TECHNOLOGY CO., LTD., Guangdong (CN)

(72) Inventors: Naiqi Chen, Guangdong (CN); Gang Chen, Guangdong (CN)

(73) Assignee: SHENZHEN ANTELAND TECHNOLOGY CO., LTD., Guangdong (CN)

( * ) Notice: Subject to any disclaimer, the term of this patent is extended or adjusted under 35 U.S.C. 154(b) by 283 days.

(21) Appl. No.: 18/228,129

(22) Filed: Jul. 31, 2023

(65) Prior Publication Data

US 2024/0100859 A1 Mar. 28, 2024

(30) Foreign Application Priority Data

Sep. 23, 2022 (CN) .......................... 202211166416.1

(51) Int. Cl.
*B41J 2/455* (2006.01)
*G06T 1/00* (2006.01)
*G06T 5/00* (2024.01)

(52) U.S. Cl.
CPC .................. *G06T 5/00* (2013.01); *B41J 2/455* (2013.01); *G06T 1/0007* (2013.01)

(58) Field of Classification Search
CPC .. B41J 2/447; B41J 2/455; G06T 5/00; G06T 1/00; G06T 1/0007
See application file for complete search history.

(56) References Cited

U.S. PATENT DOCUMENTS

2003/0179278 A1* 9/2003 Seibert ...................... B41J 2/45
  347/234
2006/0060798 A1* 3/2006 Miyagawa .......... G03F 7/70291
  250/492.1

(Continued)

FOREIGN PATENT DOCUMENTS

CN        1786810 A      6/2006
CN      104570619 A      4/2015
(Continued)

OTHER PUBLICATIONS

Jie, Z. et al. "Mechanism Study on the Coherent Microscopic Imaging with Super Resolution Based on Fourier Spectrum Shifting" Physics and Engineering, 2022, 32(1), 8 pages (English Abstract).

(Continued)

*Primary Examiner* — Douglas X Rodriguez
*Assistant Examiner* — Kendrick X Liu
(74) *Attorney, Agent, or Firm* — CANTOR COLBURN LLP

(57) ABSTRACT

The embodiments of the disclosure provide an image data processing method for laser imaging, a computer device and a computer-readable storage medium. In the embodiments, in case where the gap distance corresponding to a previous laser is not an integer multiple of the preset width of pixel row, the image resolution for a scan area associated with a next adjacent laser is increased to the second resolution to decrease the width of pixel row in the associated scan area, thereby more pixel rows may be obtained in the same area in the raw scan image, and the pixel rows closer to the position actually scanned by the laser spot may be selected as the target pixel rows, which may decrease the deviation between the position of the pixel row actually scanned by the laser and the theoretical position of the pixel row, and further improve the laser scan imaging accuracy.

20 Claims, 4 Drawing Sheets

(56) References Cited

U.S. PATENT DOCUMENTS

| | | | |
|---|---|---|---|
| 2010/0127431 A1 | 5/2010 | Sandstrom | |
| 2011/0222571 A1* | 9/2011 | Marsh | B41J 2/451 372/50.122 |
| 2017/0173875 A1 | 6/2017 | Lissotschenko | |
| 2021/0200079 A1 | 7/2021 | Luo et al. | |

FOREIGN PATENT DOCUMENTS

| | | | |
|---|---|---|---|
| CN | 110515093 A | 11/2019 | |
| CN | 112764320 A | 5/2021 | |
| CN | 113189848 A | 7/2021 | |
| CN | 113888448 A | 1/2022 | |
| CN | 113888449 A | 1/2022 | |
| CN | 114216417 A | 3/2022 | |
| CN | 114280895 A | 4/2022 | |
| CN | 114326320 A | 4/2022 | |
| CN | 114415477 A | 4/2022 | |
| EP | 1147906 A2 | 10/2001 | |
| EP | 1811339 A1 | 7/2007 | |
| GB | 0504957 | 4/2005 | |
| JP | 2014071280 A | 4/2014 | |
| KR | 20190022402 A | 3/2019 | |

OTHER PUBLICATIONS

Notification of Grant dated Nov. 8, 2022; CN Application No. 202211166416.1; 5 pages (English).
Notification of Grant dated Nov. 8, 2022; CN Application No. 202211166416.1; 5 pages (non-English).

\* cited by examiner

IMAGE DATA PROCESSING METHOD FOR LASER IMAGING, COMPUTER DEVICE, AND COMPUTER-READABLE STORAGE MEDIUM

CROSS-REFERENCE TO RELATED APPLICATIONS

This disclosure claims the benefit of Chinese Patent Application No. 202211166416.1 filed on Sep. 23, 2022, the entire contents of which are incorporated herein by reference.

TECHNICAL FIELD

The present disclosure relates to laser imaging technical field, and more particularly, relates to an image data processing method for laser imaging, a computer device and a computer-readable storage medium.

BACKGROUND

Existing laser imaging apparatus employ lasers arranged in a vertical direction to scan an exposure surface back and forth along a horizontal direction to produce images.

In an existing scan imaging method, firstly position distribution data of laser exposure points in pixel rows are obtained by Raster Image Processing (RIPping) a raw scan image, which is to be laser imaged, at a fixed resolution, and then a correlation between the pixel rows in the raw scan image and the lasers is established by assigning the pixel rows according to the theoretical spacings between the lasers. In related technologies, the theoretical spacings between the lasers are often designed to be equal, and the same number of pixel rows are assigned to each laser for scanning.

The applicant has noticed that an error (if existing) in installation of the lasers may result in inconsistent spacings between the lasers in a direction perpendicular to the scanning direction. If same number of pixel rows are set for each laser to scan without considering the difference(s) in the spacings due to the error in the installation of the lasers, the resulted image after scanning may be inconsistent with the target image, which will affect the imaging accuracy. For example, a spacing between adjacent lasers greater than the space occupied by all the pixel rows associated with the lasers may result in a gap greater than the width of a single pixel row to appear between the images exposed by the adjacent lasers; or, a spacing between adjacent lasers smaller than the space occupied by all the associated pixel rows may result in overlap of multiple pixel rows to appear between the images exposed by the adjacent lasers on the exposure surface.

Therefore, how to improve laser imaging accuracy in case where the spacings between the lasers are inconsistent in a direction perpendicular to the laser scanning direction has become a problem to be solved urgently.

SUMMARY

In view of the above-described technical problems, this disclosure provides an image data processing method for laser imaging, a computer device, and a computer-readable storage medium, to improve laser imaging accuracy.

A first aspect of the embodiments of this disclosure provides an image data processing method for laser imaging, which may include:

Obtaining a gap distance $L_i$ between vertical projecting points of light spots of adjacent lasers in a laser array in a preset straight line direction, where i is the index of each gap distance;

Calculating a ratio of each gap distance $L_i$ to $d_1$; where $d_1$ is a width of pixel row of a raw scan image resolved at a first resolution;

Determining, for each natural number N in turn, whether the gap distance $L_N$ corresponding to the $N^{th}$ laser is an integer multiple of $d_1$; and increasing an image resolution for a scan area associated with an adjacent $(N+1)^{th}$ laser to a second resolution in case where the gap distance $L_N$ is not an integer multiple of $d_1$; where the scan area associated with the $(N+1)^{th}$ laser refers to an area which starts from a boundary of a scan area associated with the $N^{th}$ laser in the raw scan image and extends along the preset straight line direction a distance less than a gap distance $L_{N+1}$;

Taking a moving step distance of the laser array along the preset straight line direction as a spacing distance; selecting, for each natural number N in turn, in the scan area associated with the $(N+1)^{th}$ laser evenly spaced target pixel rows whose distance from actually scanned pixel rows is less than a preset value; and associating and storing position data of pixel exposure points in the selected target pixel rows in the scan area associated with the same laser, where the position data of the pixel exposure points are used for controlling each laser in the laser array to expose the positions of the pixel exposure points associated with the laser.

Optionally, as a possible implementation, the image data processing method for laser imaging in the embodiments of this disclosure may also include:

Resolving an image in a scan area associated with a first laser at the first resolution;

Associating and storing the position data of the pixel exposure points in the pixel rows in the scan area associated with the first laser.

Optionally, as a possible implementation, in the embodiments of this disclosure, increasing the image resolution for the scan area associated with the adjacent $(N+1)^{th}$ laser to the second resolution includes:

Calculating a common divisor of the gap distance $L_N$ and the moving step distance as the width $d_2$ of pixel row;

Resolving an image in the scan area associated with the adjacent $(N+1)^{th}$ laser at the second resolution, such that the width of pixel row is equal to $d_2$.

Optionally, as a possible implementation, the image data processing method for laser imaging in the embodiments of this disclosure may also include:

Keeping a row resolution in the first resolution, which is along a pixel row direction, unchanged for the scan area associated with the adjacent $(N+1)^{th}$ laser.

Optionally, as a possible implementation, in the embodiments of this disclosure, increasing the image resolution for the scan area associated with the adjacent $(N+1)^{th}$ laser to the second resolution includes:

Obtaining the second resolution by increasing a column resolution in the first resolution, which is along a direction perpendicular to the pixel row direction, by a preset integer number of times; and increasing the image resolution for the scan area associated with the adjacent $(N+1)^{th}$ laser to the second resolution.

Optionally, as a possible implementation, in the embodiments of this disclosure, the moving step distance of the laser array along the preset straight line direction is equal to $d_1$.

A second aspect of the embodiments of this disclosure provides a data processing system, which may include:

An obtaining module, for obtaining a gap distance $L_i$ between vertical projecting points of light spots of adjacent lasers in a laser array in a preset straight line direction, where i is the index of each gap distance;

A calculation module, for calculating a ratio of each gap distance $L_i$ to $d_1$; where $d_1$ is a width of pixel row of a raw scan image resolved at a first resolution;

A first processing module, which determines, for each natural number N in turn, whether the gap distance $L_N$ corresponding to the $N^{th}$ laser is an integer multiple of $d_1$; and increases an image resolution for a scan area associated with the adjacent $(N+1)^{th}$ laser to a second resolution in case where the gap distance $L_N$ is not an integer multiple of $d_1$; where the scan area associated with the $(N+1)^{th}$ laser refers to an area which starts from a boundary of a scan area associated with the $N^{th}$ laser in the raw scan image and extends along the preset straight line direction a distance less than a gap distance $L_{N+1}$;

A second processing module, which takes a moving step distance of the laser array along the preset straight line direction as a spacing distance; selects, for each natural number N in turn, in the scan area associated with the $(N+1)^{th}$ laser evenly spaced target pixel rows whose distance from actually scanned pixel rows is less than a preset value; and associates and stores position data of pixel exposure points in the selected target pixel rows in the scan area associated with the same laser, where the position data of the pixel exposure points are used for controlling each laser in the laser array to expose the positions of the pixel exposure points associated with the laser.

Optionally, as a possible implementation, the first processing module may include:

A calculation unit, for calculating a common divisor of the gap distance $L_N$ and the moving step distance as the width $d_2$ of pixel row;

A processing unit, for increasing the second resolution for the scan area associated with the adjacent $(N+1)^{th}$ laser, such that the width of pixel row is equal to $d_2$.

Optionally, as a possible implementation, the first processing module may include:

A second processing unit, which obtains the second resolution by increasing a column resolution in the first resolution, which is along a direction perpendicular to the pixel row direction, by a preset integer number of times; and increases the image resolution for the scan area associated with the adjacent $(N+1)^{th}$ laser to the second resolution.

A third aspect of the embodiments of this disclosure provides a computer device, which includes a processor for executing a computer program stored in a memory to implement the step(s) in the first aspect or in any possible implementation in the first aspect.

A fourth aspect of the embodiments of this disclosure provides a computer-readable storage medium storing a computer program thereon which, when executed by a processor, may implement the step(s) in the first aspect or in any possible implementation in the first aspect.

As can be seen from the above technical solutions, the embodiments of the disclosure have the following advantages:

In the embodiments of the present disclosure, each laser in the laser array is assigned with pixel rows to be scanned according to the actual gap distances between the adjacent vertical projecting points of the light spots of each lasers in the laser array along the preset straight line direction, which may avoid overlapping pixel rows or gap(s) larger than the width of a single pixel row resulted from a same-number-pixel rows assignment, and improve the laser scan imaging accuracy.

Meanwhile, in case where the gap distance corresponding to a previous laser is not an integer multiple of the preset width of pixel row, the image resolution for a scan area associated with a next adjacent laser is increased to the second resolution to decrease the width of pixel row in the associated scan area, thereby more pixel rows may be obtained in the same area in the raw scan image, and the pixel rows closer to the position actually scanned by the laser spot may be selected as the target pixel rows, which may decrease the deviation between the position of the pixel row actually scanned by the laser and the theoretical position of the pixel row, and further improve the laser scan imaging accuracy. In addition, the deviation between the position of the pixel row actually scanned by the laser and the theoretical position of the pixel row may be completely eliminated when a specific second resolution is selected, ensuring the laser scan imaging accuracy.

DETAILED DESCRIPTION OF THE EMBODIMENTS

Figure 1:
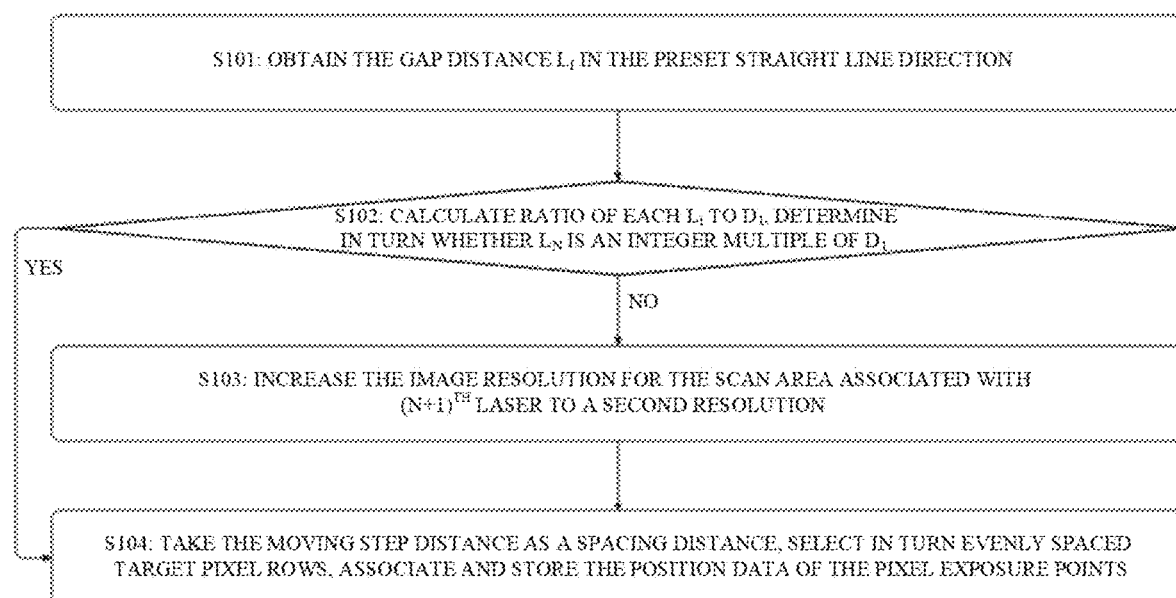
FIG. 1 is an exemplary schematic diagram of an image data processing method for laser imaging in embodiments of this disclosure.

In order to help those of ordinary skill in the art better understand the technical solutions, the technical solutions in the embodiments of this disclosure will be described clearly and completely below with reference to the accompanying drawing in the embodiments. Obviously, the described embodiments are only some embodiments of this disclosure, not all of the embodiments. All other embodiments obtained by of those of ordinary skill based on the embodiments in this disclosure without paying creative efforts shall fall within the scope of this disclosure.

In the description of this disclosure, terms "first" and "second" are only adopted for description and should not be understood to indicate or imply relative importance or implicitly indicate the number of indicated technical features. Therefore, a feature defined by "first" and "second" may explicitly or implicitly indicate inclusion of one or more of such features. In the description of this disclosure, "a plurality of" means two or more, unless otherwise limited definitely and specifically. Term "including", "comprising" and their variants are intended to cover a non-exclusive inclusion. Those of ordinary skill in the art can understand the specific meanings of the above terms in this disclosure as applicable.

For easy understanding, the application scene of the image data processing method for laser imaging in the present disclosure is described first. This disclosure is applicable to a laser array composed of a plurality of lasers, and the vertical projecting points of the lasers of the laser array along a preset straight line are nonoverlapping. In practical applications, the laser array scans an exposure surface repeatedly along a laser scanning direction (which is perpendicular to the direction of the preset straight line, where the direction of the preset straight line will be referred to as the preset straight line direction hereinafter. Generally, the laser scanning direction is parallel to the direction of the pixel row). During one scanning, multiple laser beams from the laser array parallelly scan multiple pixel rows on the exposure surface at regular intervals (which interval is determined by the installation position), so as to selectively expose the pixel points in each pixel row. After the last scanning, the lasers are moved by a fixed moving step distance along a direction perpendicular to the scanning direction (that is, along the preset straight line direction), so that the lasers can parallelly scan and expose unscanned pixel rows between segments scanned by adjacent lasers on the exposure surface.

It can be understood that the line connecting the adjacent lasers of the laser array in the present disclosure may be a straight line perpendicular to the laser scanning direction, may also be a straight line non-perpendicular to the laser scanning direction, and may also be a polyline, as long as the vertical projecting points of the lasers of the laser array along the preset straight line direction (the direction is perpendicular to the laser scanning direction) are nonoverlapping. The specific arrangement is not limited here.

The specific process of the image data processing method for laser imaging in the embodiments of this disclosure is described below. Referring to FIG. 1, an embodiment of the image data processing method for laser imaging in the embodiments of this disclosure may include following steps.

At step S101, obtain the gap distance $L_i$ between the vertical projecting points of the light spots of adjacent lasers in the laser array in the preset straight line direction.

The applicant has noticed that the error existing in the installation of the lasers of the laser array may result in inconsistent spacings between the vertical projecting points of the lasers in the preset straight line direction. If same number of pixel rows are assigned for each laser to scan without considering the difference in spacings between adjacent lasers, the resulted image areas exposed by different lasers on the exposure surface may have overlapping pixel rows or gap(s) between pixel rows. To this end, in the embodiments of the present disclosure, the actual gap distance $L_i$ of the vertical projecting points of the light spots of adjacent lasers of the laser array on the exposure surface along the preset straight line direction is obtained first, where i is the index of each gap distance. Then, pixel rows to be scanned are reasonably assigned to each laser according to the actual gap distance, such that the gap distance or overlapping pixel rows distance between the image areas exposed by different lasers is smaller than the width of a single pixel row.

For example, the gap distance between adjacent vertical projecting points of the light spots of the first laser and of the second laser in the preset straight line direction is $L_1=495$ microns, the gap distance between adjacent vertical projecting points of the light spots of the second laser and of the third laser in the preset straight line direction is $L_2=468$ microns, and the width $d_1$ of pixel row in the raw scan image at a first resolution is 20 microns. As an example, during pixel rows assignment, the $1^{st}$ to the $24^{th}$ pixel rows may be assigned to the first laser (the total width of the $1^{st}$ to the $24^{th}$ pixel rows is 480 microns), and the $25^{th}$ to the $48^{th}$ pixel rows (the total width of the $25^{th}$ to the $48^{th}$ pixel rows is 480 microns) may be assigned to the second laser, and so on until all the pixel rows resolved from the raw scan image are assigned to a respective laser. Compared with the prior art where equal number of pixel rows are assigned, the solution of this disclosure where a required number of pixel rows are assigned for each laser to scan according to the actual gap distances avoids overlapping pixel rows or a gap greater than the width of a single pixel row, and may improve laser imaging accuracy.

It should be noted that, in the embodiments of the present disclosure, each gap distance between the adjacent vertical projecting points of the light spots of the adjacent lasers in the preset straight line direction may be obtained by direct measurements of sensors, or the each gap distance may be obtained by indirect measurements on the scanning tracks of the light spots along the laser scanning direction. The specific implementation method is not limited here.

At step S102, calculate for each gap distance $L_i$ the ratio of $L_i$ to $d_1$, and determine for each natural number N in turn, whether a gap distance $L_N$ corresponding to an $N^{th}$ laser is an integer multiple of $d_1$.

Because the gap distance between adjacent vertical projecting points of the light spots of adjacent lasers in the preset straight line direction is fixed, the spacing between the actually scanned pixel rows is fixed (and equals to the gap distance $L_i$ measured in the previous step) in one scanning when the multiple lasers in the laser array carry out parallel scanning. In case where all areas in the raw scan image are resolved at the first resolution, if the width $d_1$ of a single pixel row is not a positive divisor of the gap distance $L_i$, the position of the pixel row actually scanned by the laser on the exposure surface will deviate from the theoretical position.

In an exemplary possible application scene, the gap distance between the adjacent vertical projecting points of the light spots of the first laser and of the second laser in a preset straight line direction is $L_1=495$ microns, the gap distance between the adjacent vertical projecting points of the light spots of the second laser and of the third laser in the preset straight line direction is $L_2=468$ microns, the moving step distance of the laser array along the preset straight line direction is 20 microns, and the width of a single pixel row in the raw scan image at the first resolution is 20 microns.

Figure 2:
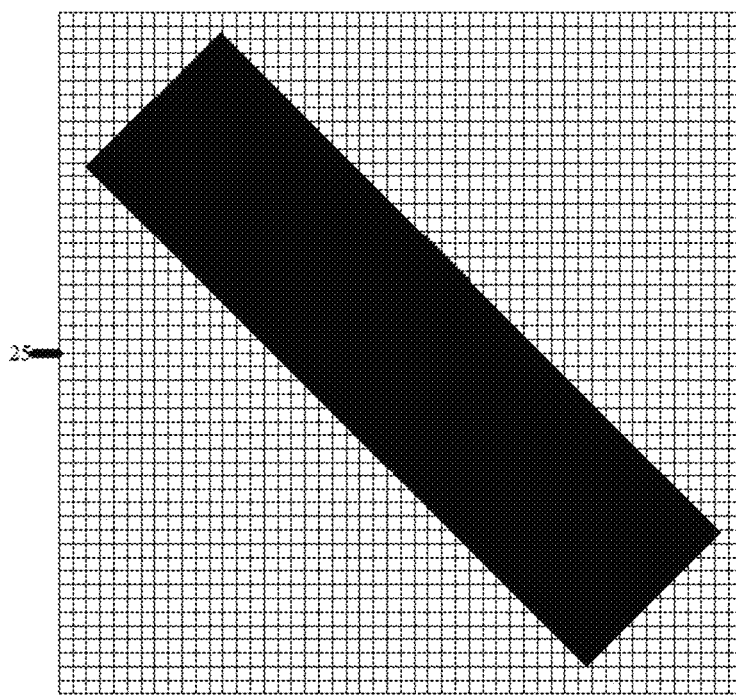
FIG. 2 is a schematic diagram of a possible pixel distribution of a raw scan image in embodiments of this disclosure.

In a possible implementation in the embodiments, a feasible pixel rows assignment is: the maximum theoretical distance occupied by the pixel rows assigned to a same laser and by the preceding pixel rows which have been assigned before is not greater than the accumulated gap distance, where the accumulated gap distance refers to the sum of the gap distance corresponding to the current laser and all the preceding gap distances, and the difference between the accumulated gap distance and the maximum theoretical distance is less than the width of a single pixel row. According to the above assignment, the area where the $1^{st}$ to the $24^{th}$ pixel rows are located may be assigned to the first laser (the sum of the gap distances occupied by the $1^{st}$ to the $24^{th}$ pixel rows is 480 microns, which is less than 495 microns), and the area where the $25^{th}$ to the $48^{th}$ pixel row (the sum of the gap distances occupied by the 48 pixel rows is 960 microns, which is smaller than the accumulated gap distance $L_1+L_2=963$ microns) are located may be assigned to the second laser for scanning, and so on until all the pixel rows resolved from the raw scan image as shown in FIG. 2 are assigned to a laser.

Figure 3:
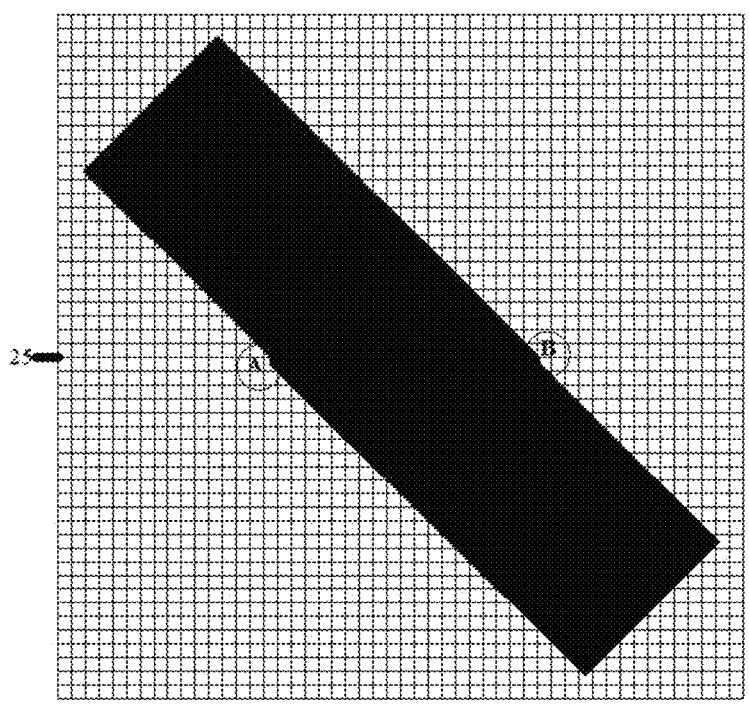
FIG. 3 is a schematic diagram of a scan image resulted after exposing and developing the raw scan image in embodiments of this disclosure.

During an actual scanning, because of the fixed positions of the lasers, when the first laser is scanning its assigned $1^{st}$ pixel row, the second laser is also scanning its assigned $1^{st}$ pixel row, and the spacing between the scanned pixel rows in the same scanning is fixed and equal to $L_1$=495 microns. If the starting boundary positions of the pixel rows actually scanned by the first laser are respectively 0 microns, 20 microns, 40 microns, 60 microns, . . . , 460 microns, then the starting boundary positions of the pixel rows actually scanned by the second laser are respectively 495 microns, 515 microns, 535 microns, . . . , 955 microns (the actually scanned pixel rows of each laser is determined by the gap distance $L_i$ between the laser and its previous laser and the moving step distance of the laser array along the preset straight line direction). However, if the raw scan image is resolved at the fixed first resolution, the theoretical boundary positions of the pixel rows (the $25^{th}$ row to the $48^{th}$ row) assigned to the second laser are respectively 480 microns, 500 microns, 520 microns, . . . , 940 microns. Obviously, the positions of the pixel rows actually scanned by the second laser are inconsistent with the theoretical positions of the assigned pixel rows, which will cause the $25^{th}$ actually scanned pixel row to be actually shifted by 15 microns along a direction away from the $1^{st}$ pixel row in the scan image formed on the exposure surface, and the subsequent $26^{th}$ to $48^{th}$ pixel rows all be shifted by 15 microns. Thereby, after development a scan image as shown in FIG. 3 is formed, in which the shifting of the pixel rows makes the oblique line to form sawtooth in area A and area B in FIG. 3, resulting in loss of imaging accuracy.

The applicant thus has found that, in the application scene of scan imaging of an existing laser array, in case where the resolution of the raw scan image is fixed and the ratio of $L_i$ to $d_1$ is not an integer, the pixel rows actually scanned by the lasers other than the first laser will be shifted relative to the positions of the pixel rows resolved from the raw scan image regardless of the pixel rows assignment. In order to further solve the problem of positional shift of the pixel rows in the above-mentioned pixel rows assignment, the applicant provides that the pixel rows assignment in the embodiments of the present disclosure can be further improved by increasing the resolution for some areas in the raw scan image.

For this purpose, after the gap distance $L_i$ is obtained, for each natural number N in turn it may be determined whether the gap distance $L_N$ corresponding to the $N^{th}$ laser is an integer multiple of $d_1$, if the gap distance $L_N$ is not an integer multiple of $d_1$, then perform the following step S103, i.e., increasing the image resolution for the scan area associated with the adjacent $(N+1)^{th}$ laser to a second resolution; and if the gap distance $L_N$ is an integer multiple of $d_1$, then keep the image resolution for the scan area associated with the adjacent $(N+1)^{th}$ laser not changed.

At step S103, increase the image resolution for the scan area associated with the adjacent $(N+1)^{th}$ laser to a second resolution.

If the gap distance $L_N$ is not an integer multiple of $d_1$, then increase the image resolution for the scan area associated with the adjacent $(N+1)^{th}$ laser to a second resolution, to decrease the width of pixel row in the associated scan area, such that more pixel rows can be obtained in the same area in the raw scan image; then select the pixel row at a position which is closer to the pixel row actually scanned by the light spot of the laser as the target pixel row, that is, select the pixel row which is at a distance smaller than a preset value (the preset value can be preset according to the required imaging accuracy) from the actually scanned pixel as the target pixel row; and associate the position data of the pixel exposure points in the selected target pixel row with the corresponding laser, such that the laser may expose and image a corresponding position on the exposure surface based on the associated position data of the pixel exposure points in the pixel row.

It should be noted that the scan area associated with the $(N+1)^{th}$ laser refers to an area which starts from the boundary of the scan area associated with the $N^{th}$ laser in the raw scan image and extends along the preset straight line direction a distance less than the gap distance $L_{N+1}$. As an example, in the above-mentioned pixel rows assignment, when N=1, the scan area associated with the $2^{nd}$ laser in the raw scan image refers to an area which starts from the boundary of the scan area associated with the $1^{st}$ laser (that is, from the lower edge of the $24^{th}$ pixel row) and extends along the preset straight line direction (that is, the direction perpendicular to the pixel row direction) a distance less than 468 microns (the area covers areas between the $25^{th}$ and the $48^{th}$ pixel row). In addition, the scan area associated with the $1^{st}$ laser is the image area which starts from the $1^{st}$ pixel row and extends along the preset straight line direction a distance less than $L_1$.

It can be understood that the specific second resolution can be reasonably set according to the actual requirement on imaging accuracy. For example, in the above-mentioned pixel rows assignment, the deviation value range of the pixel rows in the scan image can be controlled within the width value (20 microns, for example) of a single pixel row. If it is required to control the deviation value range within 10 microns, the column resolution in the second resolution (the resolution of the scan image is composed of resolutions in two directions, which are the row resolution along the pixel row direction, representing the number of pixels per unit distance (1 inch or 1 cm, or other preset distance), and the column resolution along a direction perpendicular to the pixel row, representing the number of pixel rows per unit distance) may be set to be at least twice the column resolution in the first resolution.

Optionally, as a possible implementation, in the embodiments of the present disclosure, some integer numbers may always be set and the resolution may be increased by the set number of times, for example, by 2 times, 10 times, and etc. When a gap distance $L_N$ is not an integer multiple of $d_1$, the column resolution in the initial first resolution may be directly increased by 2 times or 10 times, while the row resolution in the second resolution may remain unchanged, or may be changed accordingly.

Optionally, as a possible implementation, in the embodiments of the present disclosure, a common divisor of the gap distance $L_N$ and the moving step distance may be calculated as the width $d_2$ of pixel row, and then the image within the scan area associated with adjacent $(N+1)^{th}$ laser is resolved at the second resolution such that the width of pixel row is equal to $d_2$.

Exemplarily, take the scene of the above-mentioned pixel rows assignment as an example, the gap distance between the adjacent vertical projecting points of the light spots of the first laser and of the second laser in the preset straight line direction is $L_1$=495 microns, the gap distance between the adjacent vertical projecting points of the light spots of the second laser and of the third laser in the preset straight line direction is $L_2$=468 microns, the moving step distance of the laser array along the preset straight line direction is 20 microns, and the width of a single pixel row in the raw scan image at the first resolution is 20 microns. The common divisors of 495 and 20 contain {1, 5}, and 1 micron or 5 microns may be selected as $d_2$ to determine the second resolution for the scan area associated with the second laser. Similarly, the gap distance $L_2$ between the vertical projecting points of the light spots of the second and third lasers in the preset straight line direction is not an integer multiple of $d_1$, the common divisors of 468 and 20 contain {1, 4}, and 1 micron or 4 microns may be used as $d_3$ to determine the third resolution for the scan area associated with the third laser.

At step S104, take the moving step distance of the laser array along the preset straight line direction as a spacing distance, select for each natural number N in turn, in the scan area associated with the $(N+1)^{th}$ laser evenly spaced target pixel rows whose distance from the actually scanned pixel row is less than a preset value, and associate and store the position data of the pixel exposure points in the selected target pixel row in the scan area associated with the same laser.

Take the scan area associated with the $(N+1)^{th}$ laser in the raw scan image as an example to illustrate, and take the scan area after the image resolution for the associated scan area has been increased to the second resolution as an example, it is possible to take the moving step distance of the laser array along the preset straight line direction as the spacing distance, select in the associated scan area the target pixel rows whose distance from the actually scanned pixel rows is less than the preset value, and associate and store the position data of the pixel exposure points in the selected target pixel row. Among them, the raw scan image is Raster Image Processed (RIPped) into a binary image, which only contains two types of pixels, one type of pixels are taken as the pixel exposure points, and the other are not exposure points, and the position (distribution) data of pixel exposure points in each pixel row may be obtained.

In addition, for an area for which the resolution does not need to be changed, it is also possible to select the pixel rows to be scanned according to the above-mentioned method, and associate and store the position data of the pixel exposure points in the selected pixel rows. After assigning the associated pixel rows to each laser, during an actual scanning, the lasers may be controlled to emit laser lights to expose the corresponding pixel points when the position where the light spot of each laser may be projected is consistent with the position of each associated pixel exposure point.

Exemplarily, take the scene of the above-mentioned pixel rows assignment as an example, the gap distance between the adjacent vertical projecting points of the light spots of the first laser and of the second laser in the preset straight line direction is $L_1$=495 microns, the gap distance between the adjacent vertical projecting points of the light spots of the second laser and of the third laser in the preset straight line direction is $L_2$=468 microns, the moving step distance of the laser array along the preset straight line direction is 20 microns, and the width of a single pixel row in the raw scan image at the first resolution is 20 microns. The target area, which starts at a position of 480 microns in the raw scan image (where for the $1^{st}$ to the $24^{th}$ pixel rows, the width $d_1$ of pixel row resolved at the first resolution is 20 microns) and extends to a position of 960 microns (that is, the scan area associated with the second laser), is resolved at the second resolution to obtain the pixel rows in the target area; and the moving step distance of the laser array along the preset straight line direction is taken as the spacing distance to select the pixel rows that are consistent with the positions of the pixel rows actually scanned by the second laser, that is, the pixel rows at the positions of 495 microns, 515 microns, 535 microns, and etc. are selected as the pixel rows associated with the second laser; and the position data of the pixel exposure points in the selected pixel rows are associated and stored. In this way, the positions of the associated pixel rows selected for each laser are consistent with those of the pixel rows actually scanned by the laser, which avoids the position of the pixel rows actually scanned by the laser on the exposure surface from deviating from the theoretical positions, and improves the laser scanning accuracy.

It should be noted that the image in the scan area associated with the first laser is resolved at the first resolution (the first resolution may be preset according to the required imaging accuracy), and the position data of the pixel exposure points in the pixel rows in the scan area associated with the first laser is stored in advance. The moving step distance of the laser array along the preset straight line direction may be equal to $d_1$, or may be a positive divisor of $d_1$, which is not limited here.

As can be seen from the above disclosed content, in the embodiments of the present disclosure, each laser in the laser array is assigned with pixel rows to be scanned according to the actual gap distances between the adjacent vertical projecting points of the light spots of each lasers of the laser array in the preset straight line direction, which may avoid overlapping pixel rows or gap(s) larger than the width of a single pixel row caused by a same-number-pixel rows assignment, and improve the laser scan imaging accuracy. Meanwhile, in case where the gap distance corresponding to a previous laser is not an integer multiple of the preset width of pixel row, the image resolution for an adjacent scan area associated with a next adjacent laser is increased to the second resolution to decrease the width of pixel row in the associated scan area, thereby more pixel rows may be obtained in the same area in the raw scan image, and the pixel rows closer to the position actually scanned by the laser spot may be selected as the target pixel rows, which may decrease the deviation between the position of a pixel row actually scanned by the laser and the theoretical position of the pixel row, and further improve the laser scan imaging accuracy. In addition, the deviation between the position of the pixel row actually scanned by the laser and the theoretical position of the pixel row may be completely eliminated when a specific second resolution is set, ensuring the laser scan imaging accuracy.

The disclosure also provides an image data processing system for laser imaging, which may include:

An obtaining module, for obtaining a gap distance $L_i$ between vertical projecting points of light spots of adjacent lasers in a laser array in a preset straight line direction, where i is the index of each gap distance;

A calculation module, for calculating a ratio of each gap distance $L_i$ to $d_1$; where $d_1$ is the width of pixel row of the raw scan image resolved at a first resolution;

A first processing module, which determines for each natural number N in turn, whether the gap distance $L_N$ corresponding to the $N^{th}$ laser is an integer multiple of $d_1$; if the gap distance $L_N$ is not an integer multiple of $d_1$, then increase the image resolution for the scan area associated with the adjacent $(N+1)^{th}$ laser to a second resolution; where the scan area associated with the $(N+1)^{th}$ laser refers to an area which starts from a boundary of the scan area associated with the $N^{th}$ laser in the raw scan image and extends along the preset straight line direction a distance less than the gap distance $L_{N+1}$.

A second processing module, which takes the moving step distance of the laser array along the preset straight line direction as the spacing distance, selects for each natural number N, in the scan area associated with the $(N+1)^{th}$ laser evenly spaced target pixel rows whose distance from the actually scanned pixel rows is less than a preset value, and associates and stores the position data of the pixel exposure points in the selected target pixel rows in the scan area associated with the same laser, where the position data of the pixel exposure points are used for controlling the lasers in the laser array to expose the positions of the associated pixel exposure points.

Optionally, as a possible implementation, the first processing module may include:

A calculation unit, for calculating a common divisor of the gap distance $L_N$ and the moving step distance as the width $d_2$ of pixel row;

A processing unit, for increasing the second resolution for the scan area associated with the adjacent $(N+1)^{th}$ laser, such that the width of pixel row is equal to $d_2$.

Optionally, as a possible implementation, the first processing module may include:

A second processing unit, which obtains the second resolution by increasing the column resolution in the first resolution, which is along a direction perpendicular to the pixel row, by a preset integer number of times, and increases the image resolution for the scan area associated with the adjacent $(N+1)^{th}$ laser to the second resolution.

Those skilled in the art can clearly understand that the specific operations of the system, device and unit described above have been referred to in the corresponding processes of the method described in the foregoing embodiments, and will not be repeated here for the convenience and succinctness of description.

The data processing system in the embodiments of the disclosure has been described above with modularized functional entities. Now please refer to FIG. 4, the computer device in the embodiments of the disclosure is described on the hardware and processes thereof.

The computer device 1 may include a memory 11, a processor 12 and an input/output bus 13. The processor 12 executes a computer program to implement the steps of the above method embodiments shown in FIG. 1, such as the steps S101 to S104 shown in FIG. 1. Alternatively, the processor executes the computer program to implement the functions of the modules or units in the above-mentioned device embodiments.

In some embodiments of the disclosure, the processor is specifically used for implementing the following steps:

Obtain the gap distance $L_i$ between the vertical projecting points of the light spots of adjacent lasers in the laser array in a preset straight line direction, where i is the index of each gap distance;

Calculate the ratio of each gap distance $L_i$ to $d_1$; where $d_1$ is the width of pixel row of the raw scan image resolved at the first resolution;

Determine for each natural number N in turn, whether the gap distance $L_N$ corresponding to the $N^{th}$ laser is an integer multiple of $d_1$; if the gap distance $L_N$ is not an integer multiple of $d_1$, then increase the image resolution for the scan area associated with the adjacent $(N+1)^{th}$ laser to a second resolution; where the scan area associated with the $(N+1)^{th}$ laser refers to an area which starts from a boundary of the scan area associated with the $N^{th}$ laser in the raw scan image and extends along the preset straight line direction a distance less than the gap distance $L_{N+1}$;

Take the moving step distance of the laser array along the preset straight line direction as a spacing distance, select for each natural number N in turn, in the scan area associated with the $(N+1)^{th}$ laser evenly spaced target pixel rows whose distance from the actually scanned pixel rows is less than a preset value, and associate and store the position data of the pixel exposure points in the selected target pixel row in the scan area associated with the same laser, where the position data of the pixel exposure points are used for controlling the lasers in the laser array to expose the positions of their associated pixel exposure points;

Optionally, as a possible implementation, the processor may also be used for implementing the following steps:

Resolve the image in the scan area associated with the first laser at the first resolution;

Associate and store the position data of the pixel exposure points in the pixel rows in the scan area associated with the first laser.

Optionally, as a possible implementation, the processor may also be used for implementing the following step:

Calculate a common divisor of the gap distance $L_N$ and the moving step distance as the width $d_2$ of pixel row;

Increase the second resolution for the scan area associated with the adjacent $(N+1)^{th}$ laser, such that the width of pixel row is equal to $d_2$;

Optionally, as a possible implementation, the processor may also be used for implementing the following step:

Keep the row resolution, which is along the pixel row direction, unchanged for the scan area associated with the adjacent $(N+1)^{th}$ laser.

Optionally, as a possible implementation, the processor may also be used for implementing the following step:

Obtain the second resolution by increasing the column resolution in the first resolution, which is along a direction perpendicular to the pixel row, by a preset integer number of times, and increase the image resolution for the scan area associated with the adjacent $(N+1)^{th}$ laser to the second resolution.

The memory 11 includes at least one type of readable storage medium, and the readable storage medium includes flash memory, hard disk, multimedia card, card type memory (for example, SD or DX memory, and etc.), magnetic memory, magnetic disk, optical disk etc. The memory 11 may be an internal storage unit of the computer device 1 in some embodiments, such as a hard disk of the computer device 1. In other embodiments, the memory 11 may be an external storage device to the computer device 1, such as a plug-in hard disk, a smart memory card (Smart Media Card, SMC), a secure digital (Secure Digital, SD) card, flash memory card (Flash Card), and etc., which is equipped on the computer device 1. Further, the memory 11 may include both an internal storage unit of the computer device 1 and an external storage device. The memory 11 may be used not only to store various data and application software installed in the computer device 1, such as computer program codes, but also to temporarily store data that has been output or will be output.

In some embodiments the processor 12 may be a central processing unit (CPU), a controller, a microcontroller, a microprocessor or other data processing chips, for running the program code stored in memory 11 or processing data, such as executing a computer program, and etc.

The input/output bus 13 may be a peripheral component interconnect (PCI for short) bus or an extended industry standard architecture (EISA for short) bus or the like. The bus may be divided into address bus, data bus, control bus and so on.

Further, the computer device may also include a wired or wireless network interface 14, which may optionally include a wired interface and/or a wireless interface (such as a WI-FI interface, a Bluetooth interface, etc.), which are usually used for establishing communication connection between the computer device 1 and other electronic equipment(s).

Optionally, the computer device 1 may also include a user interface, which may include a display, an input unit such as a keyboard. Optionally, the user interface may also include a standard wired interface, a wireless interface. Optionally, in some embodiments, the display may be an LED display, a liquid crystal display, a touch-sensitive liquid crystal display, an OLED (Organic Light-Emitting Diode) touch device, and the like. Where, the display may also be appropriately referred as a display screen or a display unit, for displaying information processed in the computer device 1 and for displaying a visualized user interface.

Figure 4:
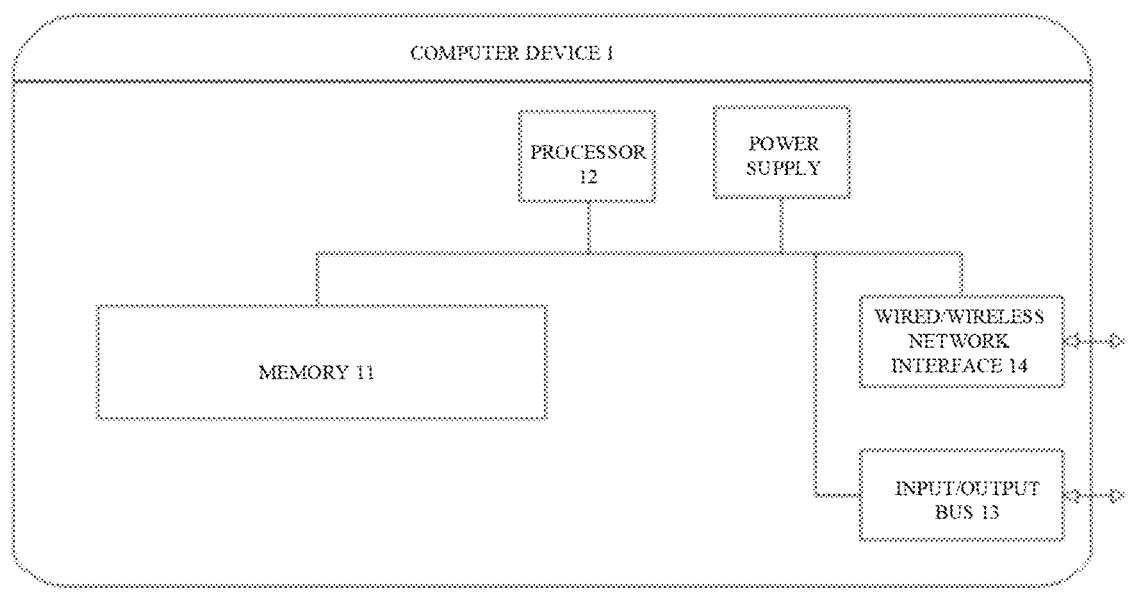
FIG. 4 is an exemplary schematic diagram of a computer device in embodiments of this disclosure.

FIG. 4 only shows the computer device 1 with components 11-14 and computer program. Those skilled in the art may understand that the structure shown in FIG. 4 does not constitute the limitation to the computer device 1, which may include fewer or more components, or combine some components, or differently arrange some components.

The present disclosure also provides a computer-readable storage medium storing a computer program thereon, which, when executed by the processor, may implement the steps in the above-mentioned embodiments shown in FIG. 1, such as the steps S101 to S104 shown in FIG. 1. Alternatively, the processor implements the functions of the modules or units in the above-mentioned device embodiments when executing the computer program.

It should be understood that the disclosed system, device and method in the embodiments provided in this disclosure may be implemented in other ways. For example, the device embodiments described above are only illustrative. For example, the division of the units is only a logic functional division, and other division is possible in practical implementation. For example, multiple units or components may be combined or integrated into another system, or some features may be ignored, or not implemented. In addition, the intercoupling or direct coupling or communication connection shown or discussed may be through some interfaces, and the indirect coupling or communication connection between devices or units may be in electrical, mechanical or in other forms.

The unit described as a separate component may or may not be physically separated, and the part displayed as a unit may or may not be a physical unit, that is, it may be located in one place, or may also be distributed on multiple network units. Part or all of the units may be selected according to actual needs to achieve the purpose of the solutions of the embodiments.

In addition, each functional unit in each embodiment of the present disclosure may be integrated into one processing unit or exist separately physically, or two or more units may be integrated into one unit. The above-mentioned integrated units may be implemented in the form of hardware or in the form of software functional units.

An integrated unit realized in the form of a software function unit and available as an independent product may be stored in a computer-readable storage medium. Based on this understanding, the technical solution of the present disclosure may essentially be embodied in the form of a software product, that is, the part of the technical solution that has contributed to the prior art may be embodied in the form of a software product, or all or part of the technical solution may be embodied in the form of a software product. The computer software product is stored in a storage medium, and includes several instructions for enabling a computer device (which may be a personal computer, a server, or a network device, etc.) to execute all or part of the steps of the method described in the various embodiments of the present disclosure. The aforementioned storage medium includes: U disk, mobile hard disk, read-only memory (ROM), random access memory (RAM), magnetic disk or optical disk, and other media that can store program codes.

The above embodiments are merely for illustrating the technical solutions of this disclosure, rather than limiting them; although this disclosure has been described in detail with reference to the foregoing embodiments, those of ordinary skill in the art should understand that it is still possible to modify the technical solutions recited in the foregoing embodiments, or equivalently replace some of the technical features therein; and these modifications or replacements do not make the essence of the corresponding technical solutions deviate from the spirit and scope of the technical solutions of the various embodiments of this disclosure.

What is claimed is:

1. An image data processing method for laser imaging, comprising:
    obtaining a gap distance $L_i$ between vertical projecting points of light spots of adjacent lasers in a laser array in a preset straight line direction, wherein i is an index of each gap distance;
    calculating a ratio of each gap distance $L_i$ to $d_1$; wherein $d_1$ is a width of pixel row of a raw scan image resolved at a first resolution;
    determining, for each natural number N in turn, whether a gap distance $L_N$ corresponding to an $N^{th}$ laser is an integer multiple of $d_1$; and increasing an image resolution for a scan area associated with an adjacent $(N+1)^{th}$ laser to a second resolution in case where the gap distance $L_N$ is not an integer multiple of $d_1$; wherein the scan area associated with the $(N+1)^{th}$ laser refers to an area which starts from a boundary of a scan area associated with the $N^{th}$ laser in the raw scan image and extends along the preset straight line direction a distance less than a gap distance $L_{N+1}$; and
    taking a moving step distance of the laser array along the preset straight line direction as a spacing distance; selecting, for each natural number N in turn, in the scan area associated with the $(N+1)^{th}$ laser evenly spaced target pixel rows whose distance from actually scanned pixel rows is less than a preset value; and associating and storing position data of pixel exposure points in selected target pixel rows in the scan area associated with the same laser, wherein the position data of the pixel exposure points are used for controlling each laser in the laser array to expose positions of the pixel exposure points associated with the laser.

2. The method according to claim 1, further comprising:
    resolving an image in a scan area associated with a first laser at the first resolution; and
    associating and storing the position data of the pixel exposure points in the pixel rows in the scan area associated with the first laser.

3. The method according to claim 2, wherein the moving step distance of the laser array along the preset straight line direction is equal to $d_1$.

4. The method according to claim 1, wherein said increasing an image resolution for a scan area associated with an adjacent $(N+1)^{th}$ laser to a second resolution comprises:
    calculating a common divisor of the gap distance $L_N$ and the moving step distance as the width $d_2$ of pixel row; and resolving an image in the scan area associated with the adjacent $(N+1)^{th}$ laser at the second resolution, such that the width of pixel row is equal to $d_2$.

5. The method according to claim 4, further comprising: keeping a row resolution in the first resolution, which is along a pixel row direction, unchanged for the scan area associated with the adjacent $(N+1)^{th}$ laser.

6. The method according to claim 1, wherein said increasing an image resolution for a scan area associated with an adjacent $(N+1)^{th}$ laser to a second resolution comprises:
obtaining the second resolution by increasing a column resolution in the first resolution, which is along a direction perpendicular to a pixel row direction, by a preset integer number of times; and increasing the image resolution for the scan area associated with the adjacent $(N+1)^{th}$ laser to the second resolution.

7. The method according to claim 1, wherein the moving step distance of the laser array along the preset straight line direction is equal to $d_1$.

8. A computer device, comprising a processor which is used for executing a computer program stored in a memory to implement an image data processing method for laser imaging,
wherein the method comprises:
obtaining a gap distance $L_i$ between vertical projecting points of light spots of adjacent lasers in a laser array in a preset straight line direction, wherein i is an index of each gap distance;
calculating a ratio of each gap distance $L_i$ to $d_1$; wherein $d_1$ is a width of pixel row of a raw scan image resolved at a first resolution;
determining, for each natural number N in turn, whether a gap distance $L_N$ corresponding to an $N^{th}$ laser is an integer multiple of $d_1$; and increasing an image resolution for a scan area associated with an adjacent $(N+1)^{th}$ laser to a second resolution in case where the gap distance $L_N$ is not an integer multiple of $d_1$; wherein the scan area associated with the $(N+1)^{th}$ laser refers to an area which starts from a boundary of a scan area associated with the $N^{th}$ laser in the raw scan image and extends along the preset straight line direction a distance less than a gap distance $L_{N+1}$; and
taking a moving step distance of the laser array along the preset straight line direction as a spacing distance; selecting, for each natural number N in turn, in the scan area associated with the $(N+1)^{th}$ laser evenly spaced target pixel rows whose distance from actually scanned pixel rows is less than a preset value; and associating and storing position data of pixel exposure points in selected target pixel rows in the scan area associated with the same laser, wherein the position data of the pixel exposure points are used for controlling each laser in the laser array to expose the positions of the pixel exposure points associated with the laser.

9. The computer device according to claim 8, wherein the method further comprises:
resolving an image in a scan area associated with a first laser at the first resolution; and
associating and storing the position data of the pixel exposure points in the pixel rows in the scan area associated with the first laser.

10. The computer device according to claim 9, wherein the moving step distance of the laser array along the preset straight line direction is equal to $d_i$.

11. The computer device according to claim 8, wherein said increasing an image resolution for a scan area associated with an adjacent $(N+1)^{th}$ laser to a second resolution comprises:
calculating a common divisor of the gap distance $L_N$ and the moving step distance as the width $d_2$ of pixel row; and
resolving an image in the scan area associated with the adjacent $(N+1)^{th}$ laser at the second resolution, such that the width of pixel row is equal to $d_2$.

12. The computer device according to claim 11, the method further comprises:
keeping a row resolution in the first resolution, which is along a pixel row direction, unchanged for the scan area associated with the adjacent $(N+1)^{th}$ laser.

13. The computer device according to claim 8, wherein said increasing an image resolution for a scan area associated with an adjacent $(N+1)^{th}$ laser to a second resolution comprises:
obtaining the second resolution by increasing a column resolution in the first resolution, which is along a direction perpendicular to a pixel row direction, by a preset integer number of times; and increasing the image resolution for the scan area associated with the adjacent $(N+1)^{th}$ laser to the second resolution.

14. The computer device according to claim 8, wherein the moving step distance of the laser array along the preset straight line direction is equal to $d_i$.

15. A computer-readable storage medium, storing a computer program thereon which, when executed by a processor, implements an image data processing method for laser imaging,
wherein the method comprises:
obtaining a gap distance $L_i$ between vertical projecting points of light spots of adjacent lasers in a laser array in a preset straight line direction, wherein i is an index of each gap distance;
calculating a ratio of each gap distance $L_i$ to $d_1$; wherein $d_1$ is a width of pixel row of a raw scan image resolved at a first resolution;
determining, for each natural number N in turn, whether a gap distance $L_N$ corresponding to an $N^{th}$ laser is an integer multiple of $d_1$; and increasing an image resolution for a scan area associated with an adjacent $(N+1)^{th}$ laser to a second resolution in case where the gap distance $L_N$ is not an integer multiple of $d_1$; wherein the scan area associated with the $(N+1)^{th}$ laser refers to an area which starts from a boundary of a scan area associated with the $N^{th}$ laser in the raw scan image and extends along the preset straight line direction a distance less than a gap distance $L_{N+1}$; and
taking a moving step distance of the laser array along the preset straight line direction as a spacing distance; selecting, for each natural number N in turn, in the scan area associated with the $(N+1)^{th}$ laser evenly spaced target pixel rows whose distance from actually scanned pixel rows is less than a preset value; and associating and storing position data of pixel exposure points in the selected target pixel rows in the scan area associated with the same laser, wherein the position data of the pixel exposure points are used for controlling each laser in the laser array to expose the positions of the pixel exposure points associated with the laser.

16. The computer-readable storage medium according to claim 15, wherein the method further comprises:

resolving an image in a scan area associated with a first laser at the first resolution; and associating and storing the position data of the pixel exposure points in the pixel rows in the scan area associated with the first laser.

17. The computer-readable storage medium according to claim 15, wherein said increasing an image resolution for a scan area associated with an adjacent $(N+1)^{th}$ laser to a second resolution comprises:

calculating a common divisor of the gap distance $L_N$ and the moving step distance as the width $d_2$ of pixel row; and resolving an image in the scan area associated with the adjacent $(N+1)^{th}$ laser at the second resolution, such that the width of pixel row is equal to $d_2$.

18. The computer-readable storage medium according to claim 17, the method further comprises:

keeping a row resolution in the first resolution, which is along a pixel row direction, unchanged for the scan area associated with the adjacent $(N+1)^{th}$ laser.

19. The computer-readable storage medium according to claim 15, wherein said increasing an image resolution for a scan area associated with an adjacent $(N+1)^{th}$ laser to a second resolution comprises:

obtaining the second resolution by increasing a column resolution in the first resolution, which is along a direction perpendicular to a pixel row direction, by a preset integer number of times; and increasing the image resolution for the scan area associated with the adjacent $(N+1)^{th}$ laser to the second resolution.

20. The computer-readable storage medium according to claim 15, wherein the moving step distance of the laser array along the preset straight line direction is equal to $d_1$.

* * * * *